ELECTRONIC STORAGE DEVICE

Original Filed Dec. 8, 1948 3 Sheets-Sheet 1

INVENTOR
RUDOLF C. HERGENROTHER
BY
ATTORNEY

ELECTRONIC STORAGE DEVICE

Original Filed Dec. 8, 1948 3 Sheets-Sheet 2

INVENTOR
RUDOLF C. HERGENROTHER
BY
Elmer J. Gorn
ATTORNEY

INVENTOR
RUDOLF C. HERGENROTHER
BY Elmer J. Gow
ATTORNEY

United States Patent Office

Re. 24,776
Reissued Feb. 9, 1960

24,776

ELECTRONIC STORAGE DEVICE

Rudolf C. Hergenrother, West Newton, Mass., assignor to Raytheon Company, a corporation of Delaware Original No. 2,548,789, dated April 10, 1951, Serial No. 64,222, December 8, 1948. Application for reissue March 26, 1953, Serial No. 344,917

9 Claims. (Cl. 313—68)

Matter enclosed in heavy brackets [ ] appears in the original patent but forms no part of this reissue specification; matter printed in italics indicates the additions made by reissue.

This application relates to electron discharge devices, and more particularly to that type of electron discharge device wherein information is stored by means of charges applied to an insulated plate, by means of an electron beam.

In a storage tube of the aforesaid type which may be used, for example, in a computer or moving target indicating radar, information is stored on an insulated electrode by positioning an electron beam such that it strikes said insulated electrode at a particular spot, and charges said electrode, at that particular spot, by a predetermined amount. Other pieces of information may be stored by repeating the process at other points on the insulated electrode. Later this plate is scanned by an electron beam and by means of the phenomenon, of secondary emission from said insulated plate, an output signal is obtained which corresponds to the information stored on the particular points on the plate.

It is an object of this invention to provide an arrangement whereby this charge, which corresponds to information, may be stored upon the insulated electrode.

A further object of this invention is to provide an improved arrangement whereby the information stored on said insulated electrode may be read and utilized.

It is a further object of this invention to provide an arrangement whereby information may be stored on said electrode more rapidly than was heretofore possible.

The foregoing and other objects of the invention will best be understood from the following description of exemplifications thereof, reference being had to the accompanying drawings, wherein.

Figure 1:
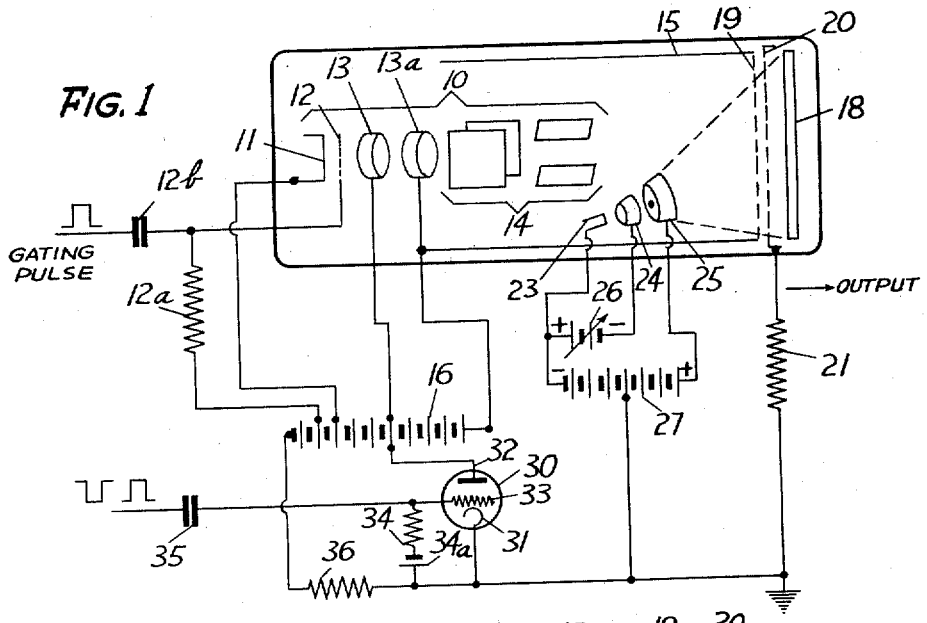
Fig. 1 represents an illustrative embodiment of my invention wherein a first electron gun is used for both the purposes of writing the information onto the insulated electrode, and of reading the information stored thereon, and a second electron gun is used to simultaneously spray the surface of the insulated electrode with electrons, to retain informational charges on the electrode.

Referring now to Fig. 1, there is shown an information storage tube having two electrical sections which are separated by two screens, 19 and 20. The first section comprises an electron gun, generally designated as 10, comprising a cathode 11, a grid 12, a focusing anode 13, an accelerating anode 13a, and a deflection plate system 14. It is to be understood that this gun may have a focusing and deflection system which may be magnetic or electrostatic as desired. Attached to the accelerating anode 13a is a cylindrical shield 15 which is spaced around the tube such as to prevent electrostatic fields outside the tube from influencing the path of the electron beam in the tube. The cathode of the gun 11 is maintained at a negative potential relative to this shield and accelerating anode by means of a battery 16 which may be of the order of 1600 volts. The density of the beam is controlled by a potential applied to the grid 12, as is shown here by way of example only, by means of a tap on the battery 16 which applies a small negative potential to grid 12 with respect to the cathode 11 on the order of approximately 5 to 15 volts. A grid resistor 12a and coupling condenser 12b are provided for the introduction of control pulses to the grid.

Thus it may be seen that the electron gun may be so adjusted as to form electrons into a stream and by means of the deflection system to determine the direction in which the beam of electrons is projected. This beam is directed towards a storage plate 18, in the second section of the tube, which is of an insulating material, such as glass covered with a layer of calcium tungstate. This plate is flat and lies at substantially right angles to the path of the beam of electrons. The construction details of the storage plate and grid structure are disclosed in greater detail in copending application, Serial No. 775,291, filed September 20, 1947, entitled Electron Discharge Device.

Between the electron gun and the storage plate, there are two screens which effectively divide the gun electrically, as aforestated, into two sections. One of the screens 19 which is parallel to the storage plate and nearest to the electron gun is maintained at the same potential as the cylindrical shield 15 by being connected thereto. The other screen 20 is positioned parallel to the storage plate 18 and between storage plate 18 and first-mentioned screen 19. This screen is connected to ground through a series resistor 21. It is across this series resistor that the output signal is developed during the reading operation of the tube.

The battery 16 is grounded at a point midway between its two terminals by means of an electronic switch arrangement comprising the tube 30 which may be a triode as shown here or any other grid controlled tube which will accomplish the same purpose. The cathode 31 of the tube is grounded. The plate of the tube 32 is attached to a tap on the battery which, for example, may be 400 volts positive from the negative end of the battery. The grid 33 is attached to ground through a suitable grid resistor 34 in series with a bias battery 34a. Positive or negative switching pulses may be fed to the grid of the tube 30 through the condenser 35 in series therewith. The negative terminal of the battery is attached to ground through a suitable resistor 36 which acts as the load for the tube 30.

The tube 30 is biased by means of battery 34a to operate about the midpoint of its $E_g$—$I_p$ curve. The value of the resistor 36 is chosen such that the current drawn therethrough by the tube 30 will cause a drop of approximately 180 volts.

Since the current drawn by the tube 30 is many times larger than the current flowing through the resistor 21, there will be no appreciable voltage drop across resistor 36 due to signal currents flowing in the memory tube.

By placing a positive or a negative pulse on the grid 33 the drop across the resistor 36 may be increased or decreased thus varying the voltage between cathode 11, of the memory tube reading and writing gun, and the signal screen 20. By means of these input pulses this target voltage is shifted within the range of from plus 100 to plus 300 volts.

The purpose of first accelerating the electron beam by a 1600 volt potential, and then decelerating it, is to create conditions under which the beam may first be formed into sharp beam, and then decelerated until it has proper striking velocity. The invention may be performed without this acceleration and deceleration heretofore recited, but the beam, upon striking the storage plate, will then be focused to a large diameter spot. Each of the screens 19 and 20 is composed of a single row of parallel wires with the wires of one screen run in the direction at right angles to the wires of the other screen. This avoids the moiré effect obtained when successive rectangular mesh screens are used. This together with the use of screens which are very fine and very close together eliminates appreciable spreading or displacement of the focused electron beam during its passage through the retarding field between the screen. If required, the wires of the screen may be braced at discrete intervals to eliminate microphonics.

Upon striking the storage plate 18, the stream of electrons by bombardment thereof causes a phenomenon known as secondary emission whereby electrons are given off by the storage plate and are picked up by the various elements in the vicinity of the storage plate, for example, the screen 20, and under certain conditions, the storage plate itself.

Figure 4:
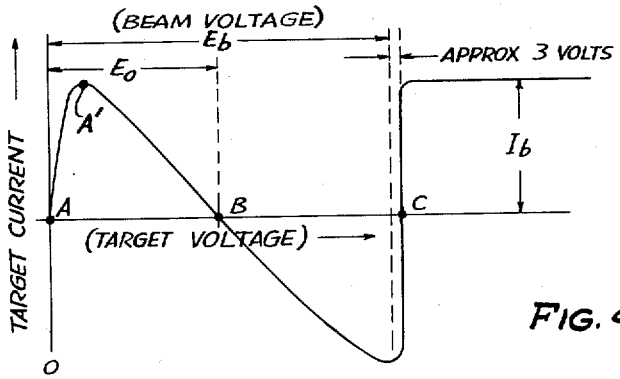
Figs. 4 and 5 are diagrams of the characteristics of the insulated electrode showing variations of the target current with effective accelerating voltage, hereafter referred to as target voltage, applied between the electron gun and the insulated electrode, said target current being influenced by secondary emission from the insulated electrode.

Referring now to Fig. 4, there is shown a curve which illustrates the behavior of the secondary emission characteristic of the storage plate.

An explanation of this curve is substantially as follows. When the target voltage is zero, as, for example, point A on the curve, the target current, defined as a net flow of electrons on to the target, is zero, since all incident electrons are reflected from the target. As the potential between the target and the cathode is increased, fewer electrons are reflected and the striking electrons produce only a small proportion of secondary electrons, and the target current curve rises steeply. When the target voltage has reached a small value, for example, 20 or 30 volts as shown by point A′, a substantial amount of secondary emission occurs, and these electrons subtract from the target current with the result that as the potential is increased, the secondary emission is increased, and the target current is decreased, until a point is reached where the target current is zero, at which time the number of electrons bombarding the target is exactly equal to the number of electrons leaving the target by means of secondary emission, as shown on the curve of point B. As the voltage is increased still further, the number of electrons leaving the target by secondary emission becomes greater than those impinging thereon, since each bombarding electron knocks off more than one electron due to its increased striking force, and as a result the target current becomes negative. As the potential is further increased, this current becomes more and more negative until a point is reached where the current starts to become less negative and finally again becomes zero. This decrease in negative target current occurs when the potential of the target has been increased to a value more positive than that of the adjacent screen 20, thus resulting in a retarding field for the electrons which are escaping from the target 18 by secondary emission. As the voltage is increased still further, the target current will become plus until it levels off to a value of approximately the beam current of the electron stream at which point virtually all of the secondary electrons escaping from the target by secondary emission are reattracted to the target.

Now if this target or storage plate 18 be of insulating material, as is the case in the present application, it may be seen that the electrons bombarding the screen will cause the voltage at that particular point on the plate to change. For example, if the plate is initially at a point to the left of point B on the curve, or the target current is positive, more electrons are landing on the target than are being emitted from it by secondary emission, thus creating a negative charge. This moves the voltage at that point lower, and this process continues until the voltage at that particular point on the storage plate is zero or point A. On the other hand, if the voltage on the screen is greater than the voltage of point B, more electrons will leave the target than will impinge thereon, and a positive charge will be built up. This positive charge will cause the target voltage to increase and the process will continue until an equilibrium condition is reached which is point C. It has been found that in general this point C will be approximately three volts more positive than the potential applied to the screen 20.

It may thus be seen that there are two positions on the S-shaped curve that are stable, such that if the target potential is at either one of those points, either A or C, no change in target charge will occur when the electron beam impinges on the target. However, if it is at any other point, it will revert to one of those two points dependent on its position on the curve. If it is of a potential lower than that of B, it will move to point A, and if it is higher than B, it will move to point C.

In actual use with an insulated storage plate of glass coated with calcium tungstate, for example, point A would be zero potential, point B would be approximately 160 volts positive with respect to the cathode and point C may be adjusted to any desired value by adjusting the potential of electrode 20 with respect to cathode. By way of example, a positive voltage of roughly 250 volts may be selected as a good operating potential for point C.

Figure 5:
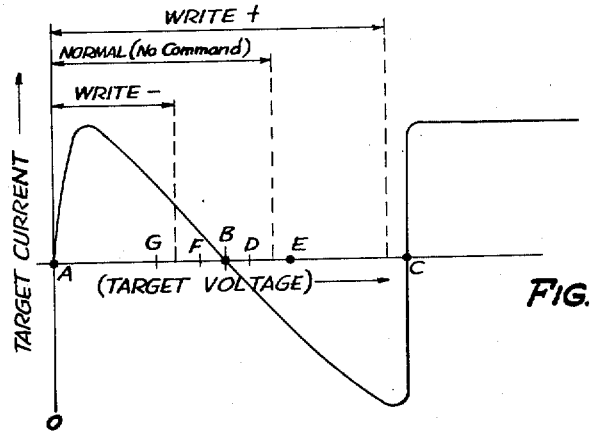

It is to be clearly understood that the electronic switch 30 is by way of example only, and any means by which the requisite voltages may be supplied between the cathode and the storage plate will suffice to accomplish the purpose of writing the information on the screen. One suitable system for writing on the screen, as shown in Fig. 5, would operate on the voltage of write minus which is a voltage slightly below the voltage of point B, a normal or no-command which is a voltage somewhat above point B, and a voltage of write plus which is approximately as great a distance above the normal voltage as the write minus voltage is below the normal voltage. The write plus voltage is somewhat below point C. Write minus, as used throughout the specification and claims, means creating a charge on an area of the storage plate such that said area has a zero potential with respect to the writing gun cathode as shown by point A on curves 4 and 5. Similarly, write plus, means creating a charge on an area of the storage plate such that the said area is charged to a predetermined stable potential above the writing gun cathode as shown by point C in Figs. 4 and 5.

Assuming it is wished to write minus, a suitable negative pulse applied to the grid 33 of the switch 30 would put the target voltage at the write minus position. The beam from the gun 10 is then turned on by a positive pulse through condenser 12b. When the beam strikes the target, more electrons will be attracted to the target than will leave it, as may be seen from the curve in Fig. 5, with the resultant negative target current, and the target charges negatively until it reaches point A or zero potential with respect to the cathode 11. The beam from gun 10 is then turned off or shifted before the switch is changed to the next desired position.

It may be seen that when the potential difference between the cathode and the storage plate is changed by changing the switch from write minus back to normal, all points on the target will go plus with respect to the cathode 11 by the amount of the voltage difference between write minus and normal. Therefore, the point previously charged to point A would move plus by this amount, and will assume a potential equal to approximately point G on the curve, which is somewhat below the write minus target potential in this case.

If it were then desired to write plus on the spot which was previously described as having been charged negatively by a write minus condition, the switch would be put in the write plus position and the voltage shown as write plus would be applied between the cathode and the storage plate. The point in question, which under normal or no-command voltage would be at point G, due to charging by the write minus condition, would be, upon the application of the write plus voltage, raised by a voltage equal to the difference between the write plus voltage and the normal or no-command voltage and would be raised to a potential D beyond point B. It is necessary that the point be raised to a potential beyond point B in order to go to the write plus equilibrium position C.

It may then be seen that the target area under bombardment will charge poistively until it reaches point C.

When the beam is then turned off or shifted to a different position and the switch returned to normal, the point on the storage plate, which was at point C, will shift negative by the amount which the entire target was shifted negative and will move to a point E which is somewhat above the normal or no-command voltage.

Similarly, if it is desired to substitute write minus information on that area which contains write plus information, the switch would be put in the write minus position and the beam positioned on that spot. This area which was at point E when the storage screen was at a normal or no-command voltage will shift by an amount equal to the overall shift of the storage plate, on the difference between the normal and write minus voltages, and consequently will move to a point F which is somewhat above the write minus voltage, but it must be below the point B. Under these conditions, it may be seen that operation is now on the poistive current section of the curve with more electrons impinged on the target than leave the target by secondary emission. Consequently, a negative charge is built up and this process will continue until point A is reached.

Therefore, it may be seen that by this system any particular area on the insulated storage electrode may be charged to either a write plus or a write minus condition at will, depending on the position of the switch 30.

A preferred method of retaining the charge on the storage plate over long periods of time and stabilizing it against interference from outside sources comprises a holding gun shown in Fig. 1, which is a second electron gun positioned to direct a stream of electrons onto the storage plate. This electron gun has a cathode 23, a control grid 24 and an accelerating anode 25.

The elements of this gun are so arranged as to spray the storage plate simultaneously over its entire storage area with electrons. The intensity of this stream is governed by the potential of the control grid with respect to the cathode and may be adjusted, for example, by means of a variable battery 26, connected between the cathode and grid, with the grid being slightly more negative than the cathode. The desired velocity of the electrons is obtained by applying a suitable potential between the cathode 23 and accelerating anode 25 by means, for example, of battery 27 which may be of the order of 1600 volts.

Since this sprayed beam passes through the two previously described decelerating screens 19 and 20, the effective target voltage of this sprayed beam is determined by the voltage difference between the cathode 23 and the screen 20.

Figure 6:
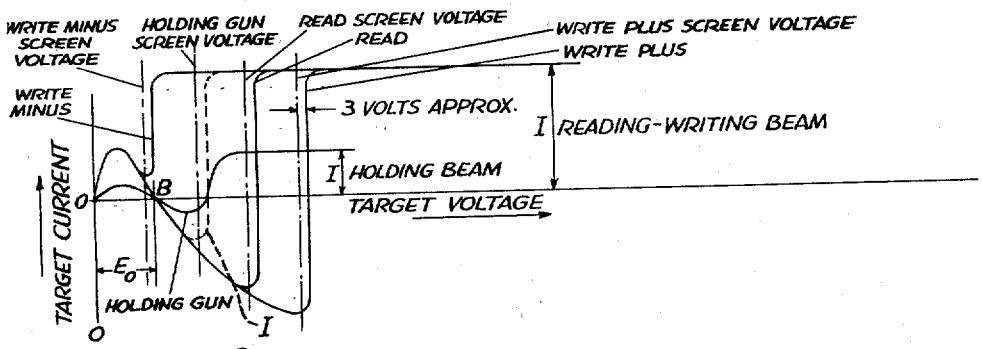
Fig. 6 shows further characteristic curves of target current versus target voltage.

Referring now to Fig. 6, there is shown a series of curves illustrating the use of this holding gun. These show the operating curves for the target voltages of the write minus, write plus, and holding beams. $E_0$ is the middle point or point B on the curve, wherein an unstable zero target current is obtained.

The write minus curve, for example, is the curve of target current that would be obtained using the write gun only and with a potential between the write gun cathode and screen 20 set at a value that is somewhat less than $E_0$, as shown by the dashed line labeled "write minus screen voltage" that is approximately three volts less than the vertical section of the write minus curve. If the potenital of the storage plate were varied from zero through the range of voltages involved, while holding the potential of screen 20 constant, the curve write minus would be obtained. It is to be noted that it goes sharply positive at approximately three volts beyond the voltage of the screen 20. Similarly, the curve labeled "read" and the curve labeled "write plus" are target current curves for various voltages applied between the screen 20 and the gun 10, said voltages being equal to the vertical part of the particular current curve minus three volts, as shown by the dashed lines.

The curve labeled "holding gun" is the characteristic of the second or holding gun target voltage versus current phenomenon and is somewhat lower than the other curves since it was so adjusted by the setting of the grid bias battery 26. However, as shown by the dotted curve labeled 1, it could be adjusted to an equal amplitude by the other curves, if desired.

Since the storage plate is an insulator, the curves will represent the current characteristics of the beam used to charge areas of the storage plate, and if the target current is positive, the charge will move toward the zero voltage as will be the case at all times in the write minus curve, and in the case of the other three curves the charge will move toward zero when the target voltage is less than $E_0$. On the other hand, if the target voltage is greater than $E_0$, the other three curves will move to their respective stable points which are approximately three volts more positive than the potential between the screen 20 and the cathode. These curves have all been drawn using the cathode as zero potential and varying the potential of the storage plate.

Figure 7A:
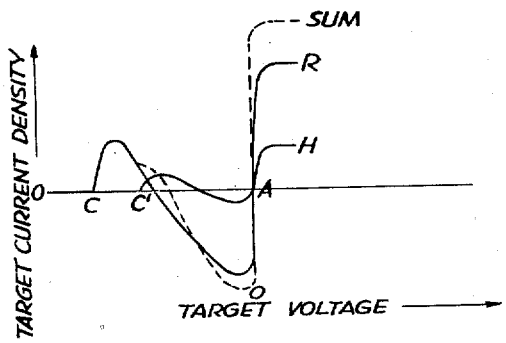
Figs. 7a, 7b, and 7c show further characteristics of the insulated electrode when acted upon by two electron guns simultaneously.
Figure 7B:
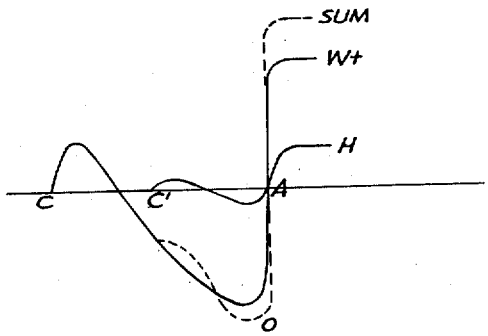
Figure 7C:
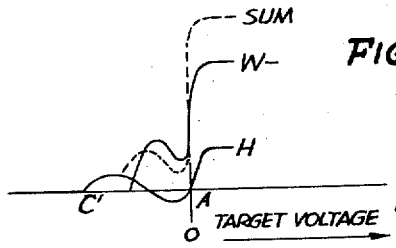

Figs. 7a, 7b, and 7c illustrate the result of the effect of both of the guns applied to the screen at the same time. Since the cathodes of the two guns are at different potentials, the target voltage has been taken as zero and the voltage of the two guns drawn on a negative scale, labeled "target voltage." Fig. 7a shows the sum of the read and the hold gun curves, labeled R and H respectively. Fig. 7b shows the sum of the write plus and hold gun curves, labeled W and H respectively, and Fig. 7c shows the sum of the write minus and hold gun curves labeled W and H respectively.

Since the holding gun is spraying the entire storage area of the storage plate at all times, it follows that in the absence of the reading and writing electron beam the potential of the area charges will be at one of the two stable points of the holding electron beam, namely, points A or C'.

If it is desired to write minus information on the storage target, a negative pulse is applied to the grid of electronic switch 30 to create the write minus condition shown in Fig. 7c. If the information already on the screen is at write plus or point A, the sum curve is being operated in the positive current section, and a negative charge will build up until the target potential reaches point C'. Similarly, if it is desired to write positive information on the screen and the screen is already charged to the write negative condition, by putting the switch in the write positive position, as shown by curve 7b, the point C' will be, on the sum curve, at a point in the negative current region and the change will build up in a positive direction until point A is reached.

Thus it may be seen that by means of the switch 30, information in the form of either a positive or negative charge may be stored on the target and held there indefinitely by means of the holding gun. Also, the holding gun will make corrections in response to small deviations due to induced potentials due to stray fields around or near the tube, and will hold the information on the storage target when it is being read and retain it there indefinitely after the reading has been accomplished.

Information placed on the storage target may be obtained therefrom in a number of ways. One method which is satisfactory is to place the target potential at a point equal to the holding gun potential. The beam from the gun 10 is then positioned on the area of the target 18 which it is desired to read. A usable signal voltage will then be developed across the resistor 21. This voltage will be different if the area of the target is at a zero potential from what it would be if the target potential were charged to the write plus position of approximately three volts more positive than the screen 20.

This is due to the following effect. When the target voltage is at zero potential, the electrons are all reflected from the target and travel back toward the screen 20 bombarding it. The screen 20 produces a secondary emission of electrons which then travel to various other electrodes of the tube with the result that the screen 20 has an overall current which is considerably less than the overall current reflected from target 18.

However, if the target is charged to the write plus position, the electrons which travel back from the target toward screen 20 are due to secondary emission of the target 18 and their velocity upon reaching screen 20 is very low compared with those in the previously discussed zero target potential position. Hence, since the secondary emission from the screen 20 is primarily dependent on the velocity of the electrons impinging thereon, the secondary emission in this case will be low and the current from screen 20 flowing through the resistor 21 will be substantially equal to the current of the reading and writing gun 10 plus the curent from the holding gun.

It may be noted that the current from the holding gun at all times falls on various areas of the target which are oppositely charged, and therefore the output current to resistor 21 remains constant with the result that the signal voltage differential developed across the resistor 21 is due to the action of the reading and writing gun 10.

Thus it may be seen that the information stored in the tube may be read therefrom by simply scanning the target 18 with a beam from the reading gun 10, and if the target potential of the reading gun is equal to that of the holding gun, no change in charge will occur throughout the target area.

Figure 2:
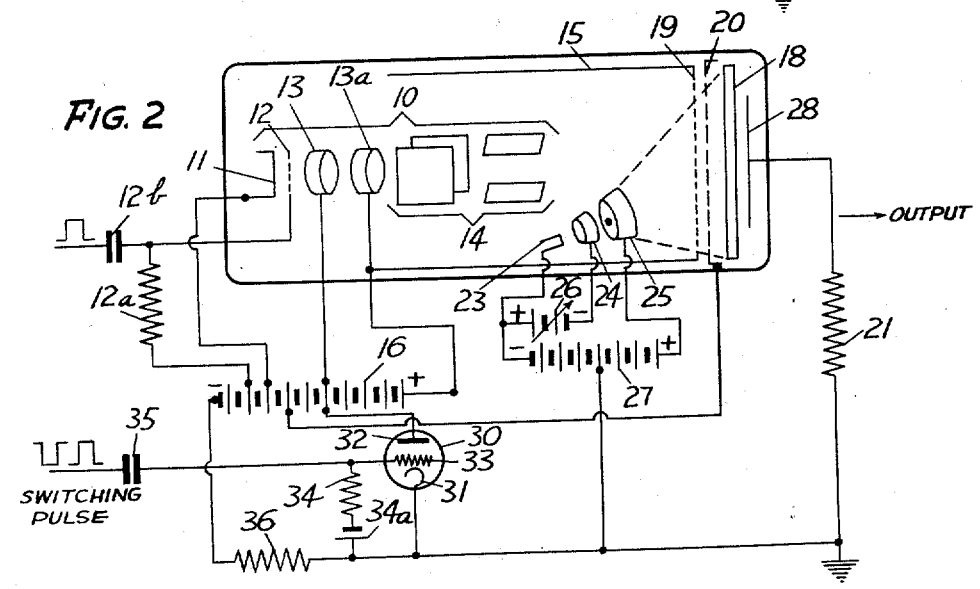
Fig. 2 shows a modification of my invention wherein a single electron gun is used to both write and read information on an insulated electrode as in Fig. 1, and the signal during the reading operation appears across a resistor in series with a conducting plate which is in close proximity with said insulated electrode and on the opposite side of said insulated electrode from the electron gun.

Fig. 2 shows an embodiment of the invention similar to Fig. 1 except that switching from write plus to write minus and to the normal positions is accomplished by means of an induction signal plate 28 which is positioned parallel to the storage plate and on the opposite side from the screen 20. By varying the voltage of the reading and writing gun with respect to this induction plate, the effective voltage between the cathode of the gun and the storage plate may be varied by inducing a charge on the storage plate through the capacity existing between the two plates to accomplish the potential shift required.

It may be seen that the potential of the screen 20 remains constant with respect to the cathode 11 of reading gun. However, since the potential of the entire electron gun and screen system may be shifted with respect to ground by the application of pulses to tube 30 and since the induction plate 28 remains the ground potential, the induced voltage on the storage plate 18 is shifted. This type of tube could be also read in the manner disclosed in connection with Fig. 1 by placing the resistor 21 in series with the screen 20. However, if as shown, it is desired to place the resistor 21 in series with the induction plate 28, the information must be read off from the target 18 by a change in the charge thereon. This is accomplished by placing the reading gun potential at a point somewhat higher than the holding gun potential. This results in an operating curve as shown in Fig. 7a. In this curve, when the target is scanned, it will be at either point A or point C' due to the holding gun action. If it is at point A the sum of the reading and holding gun curves coincide with point A and there will be no change in charge of the target 18. However, if the target potential is at point C' it will move more negative to the point labeled C on the curve, which is a stable point of the sum of the reading and holding gun curves. This change in potential from point C' to point C produces a change in the charge of the target thus inducing a compensating current flow through the resistor 21 to the induction plate 28.

After scanning, the target area read reverts back to its original charge due to holding gun action.

There would also be a change in the current to screen 20 due to the charging action of the target 18. However, this would not be used in the present case.

Thus it may be seen that the information on the target may be read therefrom by a change in the charge of the target when scanned by a reading beam.

Figure 3:
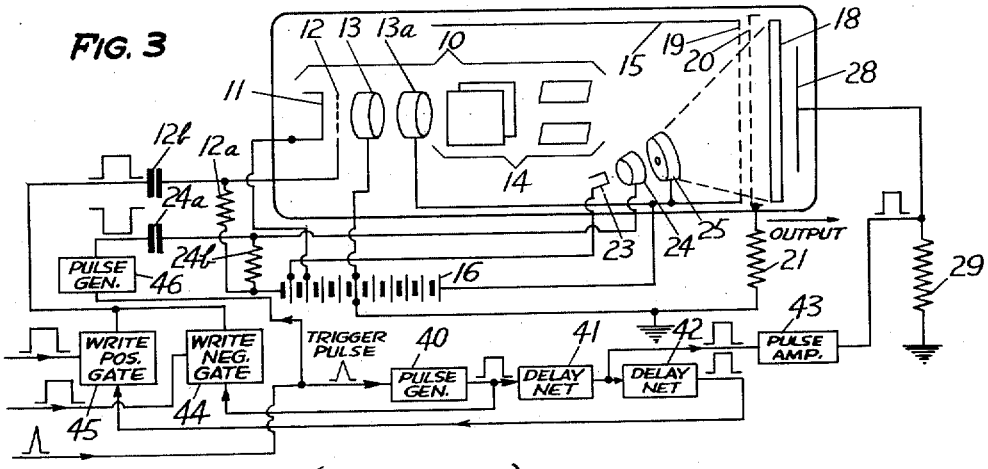
Fig. 3 represents a further modification of my invention wherein the writing time is considerably reduced by the application of suitable voltages to the insulated storage plates by means of a conducting induction plate.

In Fig. 3 there is shown a modification of the invention wherein a more rapid storing of negative charges on the storage plate may be accomplished. It has been ascertained that the charge stored on the target 18 may be changed at a considerably more rapid rate in the area of the positive equilibrium point than in the area of the negative equilibrium point. Consequently, the system of Fig. 3 discloses a method whereby all the writing may be accomplished in the area of the positive equilibrium point. In this modification a memory tube with a holding gun, a reading and writing gun and an induction plate similar to that of Fig. 2 is used. A battery 16 applies a voltage of approximately 1600 volts between the cathode and screen 19 of the tube similar to that of Figs. 1 and 2. This battery is grounded at a point between its positive and negative poles such that there is an accelerating voltage of approximately 250 volts between the cathode 11 and the screen 20. The grid 12 of the reading gun is attached to the negative electrode of the battery through a suitable resistor 12a. Cathode 11 is attachd to a tap on the battery somewhat more positive than the negative electrode such that a sufficient bias is applied to the gun to cut off the tube. Thus when a positive pulse is applied to the grid 12, for example, through a suitable condenser 12b, the reading gun will fire a stream of electrons at the target. The induction plate 28 is attached to ground through a suitable resistor 29.

The system for storing information on the target 18 operates as follows. A pulse generator 40 is triggered by any incoming signal to be stored. This pulse generator generates a rectangular pulse of a predetermined length, for example, ten microseconds, which is fed into two delay networks 41 and 42 in series. Each delay network has a certain small delay less than the length of the pulse, for example, one microsecond. The pulse is tapped off, after passing through the first delay network 41, to feed the induction plate 28. This pulse may be amplified, for example, by a pulse amplifier 43 which has the resistor 29 as its load.

In the absence of the pulse, induction plate 28 is normally at the potential of the screen 20 since they are both at ground potential. The amplitude of the pulse applied to the plate 28 is approximately equal to the potential between the cathode 11 and the screen 20 or, in this case, roughly 250 volts. Thus when the pulse is applied, the target 18 is raised above ground by substantially the amplitude of the pulse. If the beam from the gun 14 is then caused to impinge on the target 18, it will cause that area of target to be charged to the positive equilibrium point C, for example, in Fig. 4. If the beam is then turned off and the pulse removed, the entire target will be reduced in potential by about 250 volts, bringing the point which was charged to point C down to approximately the negative charge equilibrium point A.

However, if the gun 14 remains on after the pulse is removed from the induction plate 28, the point on the target will still remain charged to point C while the entire plate drops to original zero position.

Therefore, if it is desired to write minus information on the target, the writing gun is turned on before the pulse is applied to the induction plate 28 and turned off before the pulse is removed from the induction plate. However, if it is desired to write positive information on the screen, the gun is turned on after the application of the pulse to the induction plate and turned off after the pulse is removed from the induction plate.

This is accomplished by tapping off the pulse from the pulse generator 40 prior to passing it through the delay line 41 and using this pulse to trigger the writing gun 10 when it is desired to write negative. If it is desired to write positive the pulse is tapped off after passing through the second delay network 42 to trigger the writing gun.

One method of switching from write negative to write positive would be to feed the pulse from the generator 40 into a write negative gate circuit 44 and the pulse from the output of the second delay network 42 to a right positive gating circuit 45. These gating circuits are, for example, cathode follower amplifiers biased below cut-off by an amount greater than the amplitude of the pulses from the generator 40 and the delay network 42. The desired gating circuit either positive or negative could be opened to allow passage of a pulse by applying a gating voltage to the desired gate, for example, to the grid thereof, to bring the tube to a condition slightly below cut-off. The tube would then amplify the positive pulse received from the pulse generator 40 or the delay network 42 as the case might be.

The holding gun by its holding action, as previously described, tends to hold the target at the potential to which it has been previously charged. Therefore, when that potential is being charged by application of a pulse to the inductor plate 28, the holding gun may be turned off. This is accomplished by triggering a second pulse generator 46 by the same incoming trigger pulse used to trigger pulse generator 40. The output of the pulse generator 46 would be a negative pulse of somewhat greater duration than the output of the generator 40, of example, twelve microseconds. This negative pulse is applied to the grid 24 of the holding gun through a condenser 24a and across a grid resistor 24b. Thus when information is being written on the target 18, the holding gun is turned off and as soon as the writing operation ceases the holding gun is again turned on.

It is not entirely necessary that the holding gun be turned off during the writing operation since, if the leading or trailing edges of the pulse applied to the induction plate 28 are steep enough, the holding gun will not be able to charge the target 18 rapidly enough to follow the pulse and switching may be accomplished from the point A to C and vice versa.

The information stored on the target may be read by scanning the target 18 with the reading gun 14 in the absence of a pulse applied to the induction plate, while leaving the holding gun on, thus causing an output signal to develop across the resistor 21 due to the difference in secondary emission characteristics of the screen 20 as previously described.

Obviously, the holding gun could be eliminated from any of the three modifications, and the reading and writing gun could be used for holding gun purposes by the application of a suitable potential between the cathode 11 and the gun and the target 18. For example, in Fig. 3 the information stored on the target 18 is in the form of charges thereon which in the absence of pulse from pulse amplifier will produce a potential between the cathode 11 and the target 18 equal to either zero point A, or about 250 volts point C, in the curve of Fig. 4.

The reading operation is accomplished by scanning the target 18 by a beam from the reading gun 10 without applying any pulses to the induction plate 28. If the point scanned is zero potential point A, the secondary emission of screen 20 will be different from that produced when the target voltage is at point C as previously described and the output appears across resistor 21.

If the charge which was stored at point A has wandered slightly due to leakage or other phenomenon, it will recharge the point A upon being struck by the beam from gun 10. Thus by periodically scanning the target with the gun 10, the charges may be maintained at their original potentials and the need for the auxiliary holding gun is eliminated.

Many other methods of reading information stored on the target 18 can be used. For example, if the charges stored on the target 18 were at points G and E on the target voltage curve in Fig. 5, with cathode 11 to screen 20 potential equal to the normal or no-command voltage, reading could be accomplished by changing the cathode 11 to screen 20 potential to a potential equal to the write plus potential thus shifting points G and E positive to points D and C. Then when the target is scanned a voltage would occur across the resistor 21 in series with the induction plate 28 as shown in Fig. 2 dependent on the potential of the charge stored on screen 18. If the charge were at point C, it would be at an equilibrium point and no change in the charge would occur resulting in no signal in the output resistor 21 from the induction plate 28. However, if the charge were at point D, it would revert to point C due to the charging action previously described. This change in charge would induce a charge in the induction plate 28 causing an output across the resistor 21.

Since this would destroy the information on the screen, it would have to be rewritten thereon. This could be accomplished by triggering the electronic switch in response to a large output from the resistor 21 which corresponds to negative charge information through a suitable delay network to cause the gun to revert to a write negative position to rewrite the negative charge. Information could be retained on the target over long periods of time by repeating the reading operation just described intermittently.

It is to be clearly understood that any material may be used for the storage plate which will perform the operation of storing charges upon specific areas thereof and has the requisite secondary emission characteristics. Further, these circuits are by way of example only and other circuits accomplishing the same result and using this memory tube will be obvious to those skilled in the art. Accordingly, while there is herein disclosed several embodiments of the invention, many variations thereof will be apparent to those skilled in the art, and therefore, a broad interpretation of the appended claims commensurate with the scope of the invention within the art is desired.

What is claimed is:

[1. An information storage device comprising a storage member, an electron beam producing means for charging areas of said storage member, beam deflection means for positioning said electron beam on an area of said storage member, and means for reading the said information stored on said area, said reading means being directed to said area by said deflection means.]

[2. An information storage device comprising a storage member of insulating material, an electron beam producing means for charging an area of said storage member, and means for reading the said information stored on said area comprising said electron beam producing means.]

[3. An information storage device comprising a storage member, an electron beam producing means for charging areas of said storage member means for reading the said information stored on said area comprising said electron beam producing means, and means for varying a characteristic of said beam producing means to condition said beam for reading information stored on said member.]

[4. An information storage device comprising a storage member and an electron beam producing means for storing information on said member and for reading said information stored thereon, means for causing said electron beam to store information on said member, and read information stored thereon.]

[5. An information storage device comprising a storage member of insulating material, an electron beam producing means for charging areas of said storage member, beam deflection means for positioning said electron beam on an area of said storage member, and means for reading the said information stored on said area comprising said electron beam comprising means for varying a characteristic of said beam to condition said beam for reading information stored on said member.]

6. An information storage device comprising a storage member and an electron beam producing means for storing information on said member and for reading said information stored thereon, and means for retaining said information on said storage member comprising a second electron beam.

7. An information storage device comprising a storage member, an electron beam producing means for storing informational charges on said storage member, means for reading said information stored on said storage member, comprising said electron beam, means for varying a characteristic of said beam to condition said beam for reading information stored on said member, and means for retaining said information on said storage member comprising a second electron beam.

8. An information storage device comprising a storage member, an electron beam producing means for charging areas of said storage member, means for causing a negative charge to be stored on said storage member comprising conducting means adjacent said storage member for inducing a positive charge on said storage member during said charging period.

9. An information storage device comprising a storage member, an electron beam producing means for charging areas of said storage member, means for causing a negative charge to be stored on said storage member comprising highly conductive means in charge inducing relation with said member for inducing a positive charge on said storage member during said charging period comprising an induction plate adjacent said storage member.

10. An information storage device comprising a storage member, an electron beam producing means for charging areas of said storage member, means for causing a negative charge to be stored on said storage member comprising conducting means in close proximity with said storage member for inducing a positive charge on said storage member during said charging period comprising an induction plate adjacent said storage member, said induction plate being raised to a more positive potential during said charging period than during the non-charging period.

[11. An information storage device comprising an electron gun, a storage member having a pair of possible stable equilibrium potentials with respect to the cathode of said gun during bombardment of said member by electrons from said gun, and means for determining which of said equilibrium potentials exist on said member comprising means for bombarding said member with electrons from said gun.]

12. An information storage device comprising an electron gun, a storage member having a pair of possible stable equilibrium potentials with respect to the cathode of said gun during bombardment of said member by electrons from said gun, means for raising the potential of said storage member relative to said gun by an amount on the order of the difference between said pair of potentials, and means synchronized with said potential raising means for controlling said gun to bombard said member prior to the raising of said potential for a period which terminates prior to the termination of the raised potential condition.

13. An information storage device comprising an electron gun, a storage member having a pair of possible stable equilibrium potentials with respect to the cathode of said gun during bombardment of said member by electrons from said gun, means for raising the potential of said storage member relative to said gun by an amount on the order of the difference between said pair of potentials, and means synchronized with said potential raising means for controlling said gun to bombard said member after the raising of said potential for a period which terminates after the termination of the raised potential condition.

*14. An information storage device comprising a storage member of insulating material, electron beam producing means for charging an area of said storage member, means for reading information stored on said area comprising said electron beam producing means and means for bombarding said storage member with an electron beam of different cross section than the beam used for charging areas of said storage member.*

*15. An information storage device comprising an electron gun for producing bombarding electrons, a storage member having means associated therewith and with said gun for selectively charging said storage member toward either one of a pair of possible stable equilibrium potentials with respect to the cathode of said gun during bombardment of said member by electrons from said gun, and means for determining which of said equilibrium potentials exist on said member comprising means for bombarding said member with electrons from said gun.*

References Cited in the file of this patent or the original patent

UNITED STATES PATENTS

| | | |
|---|---|---|
| 2,173,257 | Klemperer | Sept. 19, 1939 |
| 2,276,359 | Von Ardenne | Mar. 17, 1942 |
| 2,407,000 | Evans | Sept. 3, 1946 |
| 2,412,520 | Langmuir et al. | Dec. 10, 1946 |
| 2,451,005 | Weimer et al. | Oct. 12, 1948 |
| 2,454,410 | Snyder | Nov. 23, 1948 |
| 2,454,652 | Iams et al. | Nov. 23, 1948 |
| 2,460,093 | Law | Jan. 25, 1949 |
| 2,462,569 | Sziklai | Feb. 22, 1949 |
| 2,464,420 | Snyder | Mar. 15, 1949 |
| 2,468,085 | Labin et al. | Apr. 26, 1949 |
| 2,470,875 | Snyder | May 24, 1949 |
| 2,501,637 | Snyder | Mar. 21, 1950 |
| 2,503,949 | Jensen | Apr. 11, 1950 |
| 2,506,742 | Rose | May 9, 1950 |
| 2,508,408 | Liebson | May 23, 1950 |
| 2,538,836 | Jensen | Jan. 23, 1951 |
| 2,639,425 | Russell et al. | May 19, 1953 |

OTHER REFERENCES

Haeff: "A Memory Tube," Electronics, September 1947, pages 80–83.

Radiation Laboratory Report 562, M.I.T., Cambridge, Mass.